United States Patent
Chiang

(10) Patent No.: US 7,492,225 B2
(45) Date of Patent: Feb. 17, 2009

(54) GAIN-CONTROLLED AMPLIFIER

(75) Inventor: Ming-Cheng Chiang, Hsin-Chu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 58 days.

(21) Appl. No.: 11/781,271

(22) Filed: Jul. 22, 2007

(65) Prior Publication Data

US 2008/0024220 A1    Jan. 31, 2008

(30) Foreign Application Priority Data

Jul. 25, 2006    (TW) ............... 95127106 A

(51) Int. Cl.
*H03F 3/45*    (2006.01)

(52) U.S. Cl. .................. 330/254; 330/257
(58) Field of Classification Search .......... 330/254, 330/253, 257, 261
See application file for complete search history.

(56) References Cited

U.S. PATENT DOCUMENTS

| 5,668,502 | A | | 9/1997 | Rijns | |
|---|---|---|---|---|---|
| 5,828,265 | A | * | 10/1998 | Mensink et al. | 327/563 |
| 6,621,343 | B2 | * | 9/2003 | Hart | 330/254 |
| 6,693,491 | B1 | * | 2/2004 | Delano | 330/282 |
| 7,368,990 | B2 | * | 5/2008 | Tsuchi | 330/261 |

* cited by examiner

*Primary Examiner*—Henry K Choe
(74) *Attorney, Agent, or Firm*—Winston Hsu

(57) ABSTRACT

A gain-controlled amplifier is disclosed including: a set of switches; first and second transistors whose second terminals are coupled to each other via a resistive element; a first current mirror, coupled to a first terminal of the first transistor, for providing a set of first currents; a second current mirror, coupled to a first terminal of the second transistor, for providing a set of second currents; a first resistive network, coupled to the second terminal of the first transistor via a current source, for providing a first output signal; and a second resistive network, coupled to the second terminal of the second transistor via another current source, for providing a second output signal. Both the first and second resistive networks have a plurality of taps, coupling to either a first current or a second current through a switch of the set of switches.

19 Claims, 1 Drawing Sheet

GAIN-CONTROLLED AMPLIFIER

BACKGROUND OF THE INVENTION

1. Field of the Invention

The present invention relates to gain-controlled amplifier techniques, and more particularly, to a gain-controlled amplifier having high linearity and high response speed, and capable of providing a negative gain.

2. Description of the Prior Art

A gain-controlled amplifier is a widely used circuit, which is designed according to practical applications. In general, three major design parameters are considered for a gain-controlled amplifier, linearity, response speed, and gain controllable range. As is well known, it is difficult to have the gain-controlled amplifier possess high linearity, high response speed, and wide gain controllable range all at the same time. For example, high linearity may be reached by utilizing an operational amplifier to implement the gain-controlled amplifier at the expense of response speed.

SUMMARY OF THE INVENTION

It is therefore one of the objectives of the present invention to provide a gain-controlled amplifier having high linearity and high response speed, and further capable of providing a negative gain so as to increase the flexibility in using the gain-controlled amplifier.

According to an exemplary embodiment of the present invention, a gain-controlled amplifier is disclosed. The gain-controlled amplifier comprises a set of switches; first and second transistors which respectively have a control terminal, a first terminal and a second terminal, second terminals of the first and second transistors being coupled to each other via a resistive element; a first current mirror which is coupled to the first terminal of the first transistor and a first terminal of the resistive element, and is for providing a set of first currents; a second current mirror which is coupled to the first terminal of the second transistor and a second terminal of the resistive element, and is for providing a set of second currents; a first resistive network which is coupled to the second terminal of the first transistor via a first current source, and is for providing a first output signal; and a second resistive network which is coupled to the second terminal of the second transistor via a second current source, and is for providing a second output signal; wherein both the first and second resistive networks have a plurality of taps, coupling to either a first current or a second current through a switch of the set of switches.

According to another exemplary embodiment of the present invention, a gain-controlled amplifier is also disclosed. The gain-controlled amplifier comprises a plurality of switches; a voltage to current converter which is for generating a set of first currents and a set of second currents according to a differential input voltage; a first resistive network which has a plurality of taps, coupling to either a first current or a second current through a switch of the set of switches; and a second resistive network which has a plurality of taps, coupling to either a first current or a second current through a switch of the set of switches; wherein the first and second resistive networks generate a differential output voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
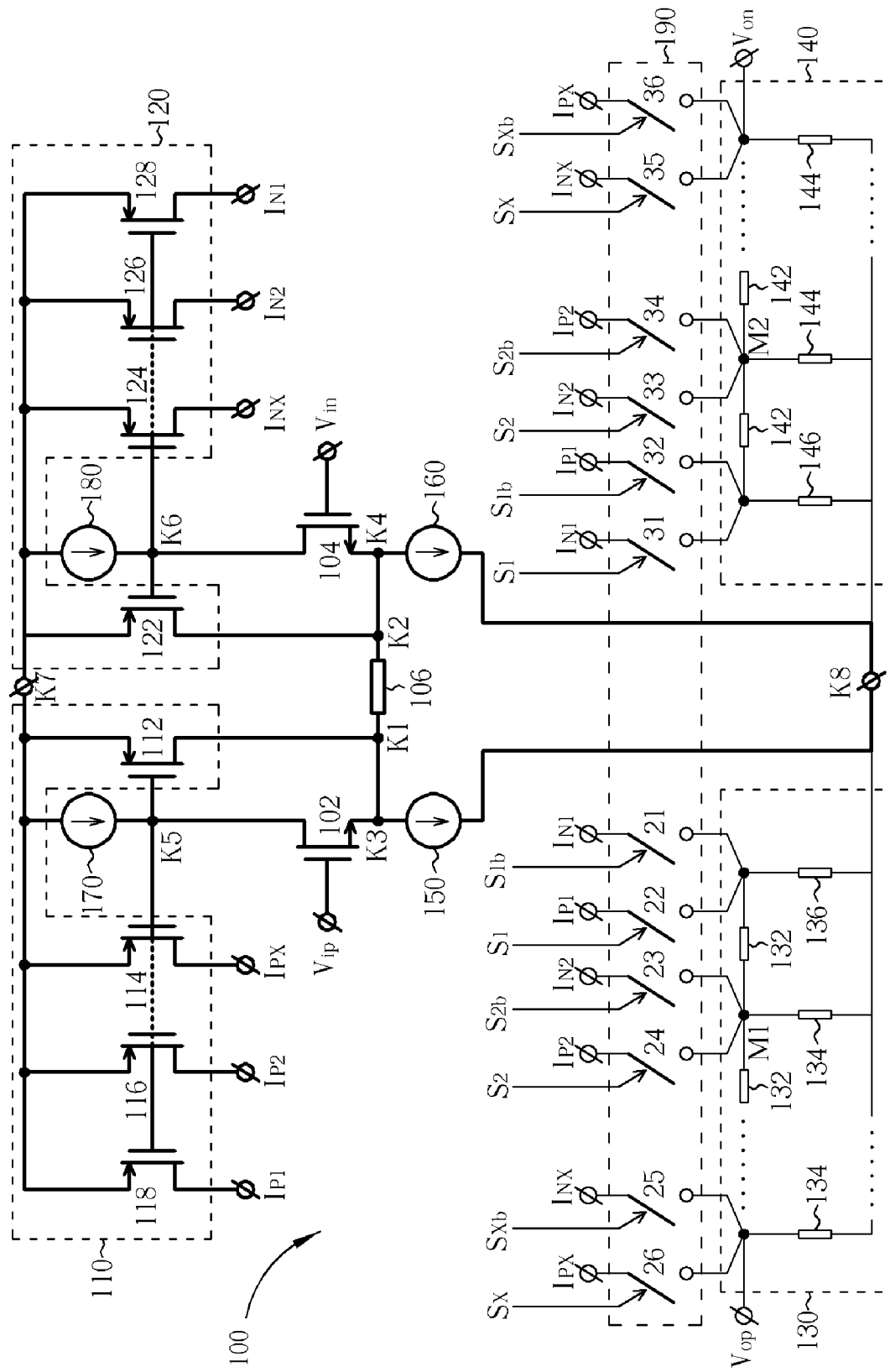
FIG. 1 is a simplified diagram illustrating a gain-controlled amplifier according to an exemplary embodiment of the present invention.

The transistors utilized in the following embodiments can be implemented by MOS transistors or bipolar transistors, and each transistor has a control terminal, a first terminal and a second terminal. For the MOS transistor, the control terminal is the gate, the first terminal is the drain, and the second terminal is the source. For the bipolar transistor, the control terminal is the base, the first terminal is the collector, and the second terminal is the emitter. In practice, an NMOS transistor can be replaced with an NPN bipolar transistor, and a PMOS transistor can be replaced with a PNP bipolar transistor.

Please refer to FIG. 1. FIG. 1 is a simplified diagram illustrating a gain-controlled amplifier 100 according to an embodiment of the present invention. As shown in FIG. 1, the gain-controlled amplifier 100 includes a first transistor 102, a second transistor 104, a resistive element 106, a first current mirror 110, a second current mirror 120, a first resistive network 130, a second resistive network 140, four current sources 150, 160, 170, and 180, and a set of switches 190, wherein the set of switches 190 includes a plurality of switches, such as switches 21, 22, 23, 24, 25, 26, 27, 28, 29, 30, 31, 32, 33, 34, 35, and 36 shown in FIG. 1. In practice, each switch in the set of switches 190 can be implemented by a MOS transistor. In the gain-controlled amplifier 100, the combination of the first transistor 102, the second transistor 104, the resistive element 106, the first current mirror 110, the second current mirror 120, and the four current sources 150, 160, 170, and 180 serves as a voltage-to-current (V-to-I) converter. Further description of the operation and implementation of the gain-controlled amplifier 100 is as follows.

In this embodiment, both the first transistor 102 and the second transistor 104 are implemented by NMOS transistors. As shown in FIG. 1, the first terminal of the first transistor 102 (i.e. drain) is coupled to the node K5, and the second terminal of the first transistor 102 (i.e. source) is coupled to the second terminal of the second transistor 104 (i.e. source) via the resistive element 106. The first terminal of the second transistor 104 (i.e. drain) is coupled to the node K6. The control terminals of the first transistor 102 and the second transistor 104 (i.e. gate) are respectively coupled to differential input voltages Vip and Vin of the gain-controlled amplifier 100. In practice, the first transistor 102 and the second transistor 104 will have substantially the same aspect ratio.

In the gain-controlled amplifier 100, the first current mirror 110 is used for supplying a set of first currents $I_{P1}, I_{P2}, \ldots, I_{PX}$, and the second current mirror 120 is used for supplying a set of second currents $I_{N1}, I_{N2}, \ldots, I_{NX}$. The first current mirror 110 includes a plurality of third transistors, such as the transistors 112, 114, 116, and 118 shown in FIG. 1, and the second current mirror 120 includes a plurality of fourth transistors, such as the transistors 122, 124, 126, and 128 shown in FIG. 1. In this embodiment, all of the transistors in the first current mirror 110 and the second current mirror 120 are PMOS transistors. In practice, the third transistors in the first current mirror 110 should have the same aspect ratio; similarly, the fourth transistors in the second current mirror 120 should also have the same aspect ratio.

In the first current mirror 110, the first terminal of the transistor 112 (i.e. drain) is coupled to the first terminal of the resistive element 106, the node K1, while the first terminals of other transistors (i.e. transistors 114, 116, and 118 in FIG. 1) are used for outputting the set of first currents $I_{P1}, I_{P2}, \ldots, I_{PX}$. As shown in FIG. 1, since the control terminal of each third transistor in the first current mirror 110 (i.e. gate) is coupled to the node K5, the first terminal of the first transistor 102 (i.e. drain), and the second terminal of each third transistor (i.e. source) are coupled to the node K7. In this way, each current of the set of first currents $I_{P1}, I_{P2}, \ldots, I_{PX}$ has the same current value as the drain current of the transistor 112.

Equally, in the second current mirror 120, only the first terminal of the transistor 122 (i.e. drain) is coupled to the second terminal of the resistive element 106, and the node K2, and the first terminals of other transistors (i.e. transistors 124, 126, and 128 in FIG. 1) are used for outputting the set of second currents $I_{N1}, I_{N2}, \ldots, I_{NX}$. As shown in FIG. 1, since the gate of each fourth transistor in the second current mirror 120 is coupled to the node K6, the drain of the second transistor 104, and the source of each fourth transistor are coupled to the node K7. In this way, each current of the set of second currents $I_{N1}, I_{N2}, \ldots, I_{NX}$ has the same current value as the drain current of the transistor 122.

As shown in FIG. 1, the first current source 150 is coupled between the node K3 and the node K8; the second current source 160 is coupled between the node K4 and the node K8; the third current source 170 is coupled between the node K7 and the node K5; and the fourth current source 180 is coupled between the node K7 and the node K6. In this embodiment, the current values of the currents supplied by the first current source 150 and the second current source 160 are both I1, and the current values of the currents supplied by the third current source 170 and the fourth current source 180 are both I2.

In operation, the source voltage of the first transistor 102 (i.e. voltage at the node K3) will change with the variation of the gate voltage Vip of the first transistor 102, and the source voltage of the second transistor 104 (i.e. voltage at the node K4) will change with the variation of the gate voltage Vip of the second transistor 104. When there is a potential difference between the node K3 and the node K4, the drain currents of the transistor 112 and the transistor 122 will change so as to change the current values of the set of first currents and the set of second currents. Suppose the resistive element 106 is implemented by a resistor whose resistance value is R0. The current value of the current outputted from the first current mirror 110 can be represented by the following equation:

$$I_{PY}=(Vip-Vin)/R0+I1-I2 \quad Y=1, 2, \ldots, x \quad (1)$$

The current value of the current outputted from the second current mirror 120 can be represented by the following equation:

$$I_{NY}=(Vin-Vip)/R0+I1-I2 \quad Y=1, 2, \ldots, x \quad (2)$$

In the gain-controlled amplifier 100, the first resistive network 130 and the second resistive network 140 are symmetric to each other. In this embodiment, both the first resistive network 130 and the second resistive network 140 are implemented by a resistor network respectively. As shown in FIG. 1, the first resistive network 130 includes a plurality of resistors 132, a plurality of resistors 134 and a resistor 136, and the second resistive network 140 includes a plurality of resistors 142, a plurality of resistors 144 and a resistor 146. The resistance value of the resistors 132 and 142 is R1, the resistance value of the resistors 134 and 144 is R2, and the resistance value of the resistors 136 and 146 is R3. The above-mentioned resistance value combination is merely one embodiment of the present invention, however. In practice, the resistance value combination can be any possible combination of R1, R2 and R3. Both the first resistive network 130 and the second resistive network 140 have a plurality of taps, each coupling to either a first current or a second current through one switch of the set of switches 190. In this embodiment, the switches included in the set of switches 190 are coupled to the taps of the first resistive network 130 and the second resistive network 140 in pairs, and the control signals for each pair of the switches $S_Y$ and $S_{Yb}$ (Y=1, 2, ..., x) are opposite to each other so only one switch will be ON for every pair of switches. For example, when the switch 21 is ON, the switch 22 is OFF. In this embodiment, each control signal $S_Y$ is either 0 or 1 so that $S_{Yb}=1-S_Y$. Moreover, when one tap in the first resistive network 130 is coupled to a first current, a counterpart tap disposed at a symmetric position in the second resistive network 140 will be coupled to a second current. For example, when tap M1 in the first resistive network 130 is coupled to a first current $I_{P2}$, a counterpart tap M2 in the second resistive network 140 will be coupled to a second current $I_{N2}$.

For convenience of explanation, it is provided that the resistance value of R1 is equal to R3 and R2 is twice R1 in the first resistive network 130 and the second resistive network 140. In other words, both the first resistive network 130 and the second resistive network 140 are an R–2R ladder network. Under this assumption, the relation between the output voltage Vop of the first resistive network 130 and the differential input voltage of the gain-controlled amplifier 100, Vip and Vin, can be represented by the following equation:

$$Vop = R1 \cdot \sum_{Y=1}^{x} [I_{PY} \cdot S_Y + I_{NY} \cdot (1-S_Y)] \cdot 2^{-(X-Y)} \quad (3)$$

$$= R1 \cdot \sum_{Y=1}^{x} \left\{ \left[ \left(\frac{(Vip-Vin)}{R0} + I1 - I2\right) \cdot S_Y + \left(\frac{(Vin-Vip)}{R0} + I1 - I2\right) \cdot (1-S_Y) \right] \cdot 2^{-(X-Y)} \right\}$$

$$= R1 \cdot \sum_{Y=1}^{x} \left\{ \left[ \frac{(Vin-Vip)}{R0} \cdot (1-2 \cdot S_Y) + (I1-I2) \right] \cdot 2^{-(X-Y)} \right\}$$

$$= (Vip-Vin) \cdot \frac{R1}{R0} \cdot \sum_{Y=1}^{x} [(1-2 \cdot S_Y) \cdot 2^{-(X-Y)}] + R1 \cdot$$

$$(I1-I2) \cdot \sum_{Y=1}^{x} 2^{-(X-Y)}$$

$$= (Vip-Vin) \cdot \frac{R1}{R0} \cdot \sum_{Y=1}^{x} [(1-2 \cdot S_Y) \cdot 2^{-(X-Y)}] +$$

$$R1 \cdot (I1-I2) \cdot (2-2^{1-X})$$

In the same way, the relation between the output voltage Von of the second resistive network 140 and the differential input voltage of the gain-controlled amplifier 100, Vip and Vin, can be represented by the following equation:

$$Von = \quad (4)$$

$$(Vin-Vip) \cdot \frac{R1}{R0} \cdot \sum_{Y=1}^{x} [(1-2 \cdot S_Y) \cdot 2^{-(X-Y)}] + R1 \cdot (I1-I2) \cdot (2-2^{1-X})$$

In light of the above equations (3) and (4), it can therefore be known that the output common mode of the first resistive network 130 and the second resistive network 140 are both $R1 \cdot (I1-I2) \cdot (2-2^{1-X})$. In this embodiment, the differential output signal of the gain-controlled amplifier 100 is as below:

$$Vop - Von = (Vip - Vin) \cdot \frac{R1}{R0} \cdot \sum_{Y=1}^{X} [(1 - 2 \cdot S_Y) \cdot 2^{-(X-Y)}] \cdot 2 \quad (5)$$

Dividing the equation (5) by the differential input signal of the gain-controlled amplifier 100, i.e. Vip−Vin, the gain of the gain-controlled amplifier 100 can be obtained as below:

$$\text{Gain} = \frac{R1}{R0} \cdot \sum_{Y=1}^{X} [(1 - 2 \cdot S_Y) \cdot 2^{-(X-Y)}] \cdot 2 \quad (6)$$

It can therefore be known from equation (6) that the gain of the gain-controlled amplifier 100 in this embodiment is related to the resistance value R0 of the resistive element 106, the control signals $S_1, S_2, \ldots, S_X$, and the resistance values in the first resistive network 130 and the second resistive network 140; however, the gain of the gain-controlled amplifier 100 is independent of resistance values of switches in the set of switches 190. Even if the impedance value of each switch of the set of switches 190 is nonlinear, the gain of the gain-controlled amplifier 100 will not be affected; therefore, the gain-controlled amplifier 100 disclosed above has an excellent linearity. In addition, each control signal $S_Y$ is either 0 or 1 in this embodiment so that the term $(1-2*S_Y)$ in equation (6) is either 1 or −1. For this reason, if the control signals $S_1, S_2, \ldots, S_X$ are programmed properly, the gain-controlled amplifier 100 of this embodiment is capable of providing a negative gain so as to increase the flexibility in using the gain-controlled amplifier 100.

On the other hand, the above-mentioned gain-controlled amplifier 100 is implemented by a V-to-I converter and two resistance networks symmetric to each other, so that the response speed of the gain-controlled amplifier 100 is better than that of a conventional gain-controlled amplifier implemented by operational amplifiers. In practice, the PMOS transistors in the above-mentioned gain-controlled amplifier 100 can be replaced with NMOS transistors, and vice versa.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gain-controlled amplifier, comprising:
   a set of switches;
   first and second transistors, respectively comprising a control terminal, a first terminal and a second terminal, second terminals of the first and second transistors being coupled to each other via a resistive element;
   a first current mirror, coupled to the first terminal of the first transistor and a first terminal of the resistive element, for providing a set of first currents;
   a second current mirror, coupled to the first terminal of the second transistor and a second terminal of the resistive element, for providing a set of second currents;
   a first resistive network, coupled to the second terminal of the first transistor via a first current source, for providing a first output signal; and
   a second resistive network, coupled to the second terminal of the second transistor via a second current source, for providing a second output signal;
   wherein the first and second resistive networks respectively comprise a plurality of taps coupling to either a first current in the set of first currents or a second current in the set of second currents through one switch in the set of switches.

2. The gain-controlled amplifier of claim 1, wherein the first transistor and the second transistor have substantially the same aspect ratio.

3. The gain-controlled amplifier of claim 1, wherein the first resistive network is substantially symmetric to the second resistive network.

4. The gain-controlled amplifier of claim 1, wherein both the first resistive network and the second resistive network are resistor networks.

5. The gain-controlled amplifier of claim 4, wherein the resistor networks are R-2R ladder networks.

6. The gain-controlled amplifier of claim 1, wherein the first current mirror comprises at least a plurality of third transistors each having a first terminal, a second terminal and a control terminal coupled to the first terminal of the first transistor, and second terminals of the third transistors being coupled to each other.

7. The gain-controlled amplifier of claim 6, wherein the first terminal of a third transistor of the plurality of third transistors is coupled to the first terminal of the resistive element, and the first terminals of other third transistors are used for supplying the set of first currents.

8. The gain-controlled amplifier of claim 6, wherein the plurality of third transistors have substantially the same aspect ratio.

9. The gain-controlled amplifier of claim 1, wherein the second current mirror comprises at least a plurality of fourth transistors each having a first terminal, a second terminal and a control terminal coupled to the first terminal of the second transistor, and second terminals of the fourth transistors being coupled to each other.

10. The gain-controlled amplifier of claim 9, wherein the first terminal of a fourth transistor of the plurality of fourth transistors is coupled to the second terminal of the resistive element, and the first terminals of other fourth transistors are used for supplying the set of second currents.

11. The gain-controlled amplifier of claim 9, wherein the plurality of fourth transistors have substantially the same aspect ratio.

12. The gain-controlled amplifier of claim 1, wherein currents supplied by the first and second current sources have substantially the same current value.

13. The gain-controlled amplifier of claim 1, further comprising a third current source and a fourth current source, respectively coupled to the first terminal of the first transistor and the first terminal of the second transistor.

14. The gain-controlled amplifier of claim 13, wherein currents supplied by the third and fourth current sources have substantially the same current value.

15. The gain-controlled amplifier of claim 1, wherein the control terminals of the first and second transistors are differential input terminals of the gain-controlled amplifier.

16. A gain-controlled amplifier, comprising:
    a plurality of switches;
    a voltage-to-current (V-to-I) converter, for generating a set of first currents and a set of second currents according to a differential input voltage;

a first resistive network, having a plurality of taps coupling to either a first current in the set of first currents or a second current in the set of second currents through a switch in the plurality of switches; and a second resistive network, having a plurality of taps coupling to either a first current in the set of first currents or a second current in the set of second currents through a switch in the plurality of switches;

wherein the first and second resistive networks generate a differential output voltage.

17. The gain-controlled amplifier of claim 16, wherein the first resistive network is substantially symmetric to the second resistive network.

18. The gain-controlled amplifier of claim 16, wherein both the first resistive network and the second resistive network are resistor networks.

19. The gain-controlled amplifier of claim 18, wherein the resistor networks are R-2R ladder networks.

* * * * *